(12) United States Patent
Ramaswami et al.

(10) Patent No.: US 8,593,196 B2
(45) Date of Patent: Nov. 26, 2013

(54) TEST CIRCUIT AND METHODS FOR SPEED CHARACTERIZATION

(75) Inventors: Ravi Karapatti Ramaswami, Cupertino, CA (US); Vasu P. Ganti, Los Altos, CA (US); Anh Hoang, Fremont, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 13/459,659

(22) Filed: Apr. 30, 2012

(65) Prior Publication Data

US 2013/0093488 A1 Apr. 18, 2013

Related U.S. Application Data

(60) Provisional application No. 61/547,669, filed on Oct. 14, 2011.

(51) Int. Cl.
 *H03H 11/26* (2006.01)
(52) U.S. Cl.
 USPC ............................................ 327/276; 327/279
(58) Field of Classification Search
 USPC ...................... 327/276–279, 3, 7–8
 See application file for complete search history.

(56) References Cited

U.S. PATENT DOCUMENTS

| 6,587,811 | B2 | 7/2003 | Schleifer et al. |
| 7,143,378 | B1 | 11/2006 | Nag |
| 7,855,611 | B2 | 12/2010 | Lee et al. |
| 2013/0093488 | A1 | 4/2013 | Ramaswami et al. |

*Primary Examiner* — An Luu
(74) *Attorney, Agent, or Firm* — Rory D. Rankin; Meyertons, Hood, Kivlin, Kowert & Goetzel, P.C.

(57) ABSTRACT

A system and method for efficiently performing timing characterization of regions of an integrated circuit. An integrated circuit has monitors distributed in different physical regions across its die. Each monitor includes timing characterization and self-test circuitry. This circuitry includes one or more tunable delay lines used during timing measurements. The circuitry verifies the tunable delay lines are defect free prior to the timing measurements. If defects are detected, but tunable delay lines may still be used, a scaling factor may be generated for a failing tunable delay line. The scaling factor may be used during subsequent timing measurements to maintain a high accuracy for the measurements. The timing measurements may determine a particular physical region of the die provides fast or slow timing values. The resulting statistics of the timing measurements may be used to change an operational mode of the IC in at least the particular region.

25 Claims, 17 Drawing Sheets

Parameter Table 300

Entry 302a
Entry 302b
...
Entry 302q

| Process Corner ID 304 | Region ID 306 | Maximum Clock Frequency 308 | Leakage Current 310 | Ring Oscillator Count 312 | Setup Time 314 | Hold Time 316 | Duty Cycle 318 | Tunable Delay Scaling Factor 320 | Tunable Delay Scaling Factor 322 | Region ID 324 | ... |

FIG. 3

TEST CIRCUIT AND METHODS FOR SPEED CHARACTERIZATION

CROSS REFERENCE TO RELATED APPLICATIONS

This application claims the benefit of U.S. Provisional Application No. 61/547,669 filed on Oct. 14, 2011, which is incorporated by reference herein in its entirety.

BACKGROUND OF THE INVENTION

1. Field of the Invention

This invention relates to electronic circuits, and more particularly, to efficiently performing timing characterization of regions of an integrated circuit.

2. Description of the Relevant Art

The reduction in geometric dimensions of devices and metal routes on semiconductor chips and the resulting higher integration of functionality on chips has each contributed to an increased effect of manufacturing processing defects and variations. The defects and variations may greatly affect the functionality and performance of on-die circuits. During the manufacturing processing steps, the base layers are inserted in an n-type or a p-type silicon substrate. The base layers include the n-well, p-well, diffusion, and polysilicon layers. Manufacturing defects such as relatively high resistive vias, holes in conductors, mismatches in masks for the base layers, and so forth may cause a given data path to significantly vary from an expected delay. In addition, setup and/or hold time violations may occur creating incorrect results. Stuck-at faults may also occur. In these cases, the integrated circuit (IC) malfunctions. In other cases, such as varying transistor sizes, varying leakage current amounts, and the like, the IC provides correct results, but varies from expected performance.

In one example, a first group of semiconductor wafers are processed in a similar time span by the same equipment. Still, the silicon dies in this first group of wafers may include parameters that vary from expected values due to process variations. The variations across the first group of wafers and within a given wafer for each of these silicon dies may vary in a common manner due to the similar processing conditions. Other silicon dies in a second group of wafers may be processed at another time and/or possibly on other equipment. The parameters for these other dies may vary in a different manner from dies in the first group of wafers due to the different processing conditions. The parameters may include at least leakage current, maximum operating frequency of a clock signal, power consumption, setup and hold times for sequential elements, duty cycle of a clock signal, and threshold voltage.

Dies that are not defective, but provide different measured parameters from expected parameter values may be placed in different bins according to the measured parameters. For example, speed binning may categorize dies based on maximum operational frequency. The IC dies categorized by a given bin may be offered at a different price than IC dies categorized by another bin. In addition, reliably characterizing spatially varying speeds on a given die may allow for tuning of performance-power states on the given die.

Automated test equipment (ATE) has been typically used to provide characterization of the spatially varying parameters on a given die due to process variations. The ATEs are also used to detect any delay defects in on-die tunable delay lines and calibrate them if defects are found. However, ATEs increase testing time and cost. Additionally, the ATEs are used in a test lab at the time of production. Subsequent characterizations of the parameter variations due to at least aging when the die is used over time may not be performed.

In view of the above, efficient methods and mechanisms for efficiently performing timing characterization of regions of an integrated circuit are desired.

SUMMARY OF EMBODIMENTS OF THE INVENTION

Systems and methods for efficiently performing timing characterization of regions of an integrated circuit. In one embodiment, an integrated circuit has monitors distributed in different physical regions across its die. Each monitor includes timing characterization and self-test circuitry. This circuitry may include one or more tunable delay lines used during timing measurements. These timing measurements may include at least setup time, hold time, and duty cycle measurements. The circuitry may verify the tunable delay lines are defect free prior to the timing measurements. If defects are detected, but tunable delay lines may still be used, a scaling factor may be generated for a failing tunable delay line. The scaling factor may be used during subsequent timing measurements to maintain a high accuracy for the measurements.

The timing measurements may determine a particular physical region of the die provides fast or slow timing values. The varying timing values may be due to process variations and/or device aging. The resulting statistics of the timing measurements may be used to change an operational mode of the IC in at least the particular region.

These and other embodiments will be further appreciated upon reference to the following description and drawings.

BRIEF DESCRIPTION OF THE DRAWINGS

FIG. 3 is a generalized block diagram illustrating one embodiment of a parameter table.

Figure 1:
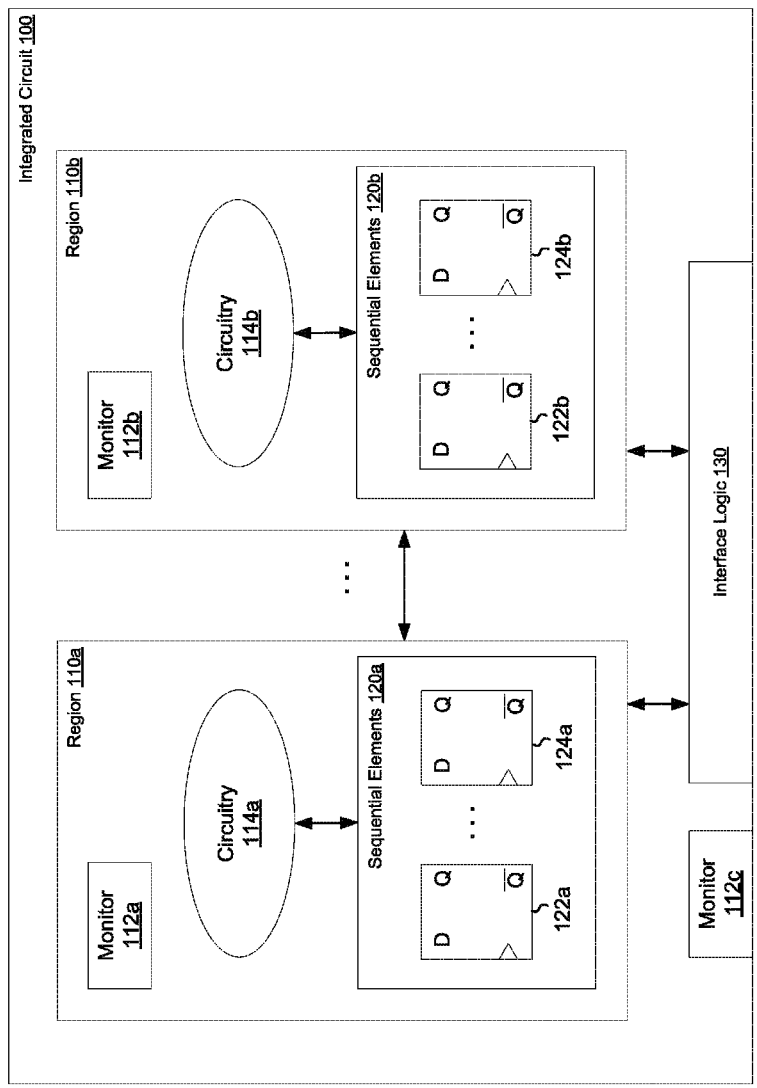
FIG. 1 is a generalized block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring now to FIG. 1, a generalized block diagram illustrating one embodiment of an integrated circuit 100 is shown. As shown, the integrated circuit 100 may include physical regions 110a-110b and interface logic 130. Although two physical regions 110a-110b are shown, the integrated circuit 100 may include several regions. Each of the regions 110a-110b may include a monitor. For example, the region 110a may include at least a monitor 112a and the region 110b may include at least a monitor 112b. One or more monitors may be included in other areas of the integrated circuit 100, such as the monitor 112c located near the interface logic 130.

The interface logic 130 may include input/output (I/O) over-voltage protection devices and any suitable I/O protocol logic. The region 110a may also include circuitry 114a and sequential elements 120a. The circuitry 114a may be used to perform arithmetic operations, binary logical operations, data comparisons, data conversions, and the like. The sequential elements 120a may include one or more data storage elements 122a and 124a that utilize a clock signal to synchronize data storage and updates. The storage elements 122a and 124a may generally include registers, flip-flops, latches, content addressable memory (CAM), random access memory (RAM), caches, and so forth.

Similarly, the region 110b may include circuitry 114b and sequential elements 120b that provide a similar functionality as the region 110a. In addition, the region 110b may provide a subset of the functionality of the region 110a. In other examples, the region 110b may provide additional functionality than the region 110a.

The integrated circuit 100 may be any semiconductor device. Examples of the integrated circuit 100 may include a microprocessor, an application specific integrated circuit (ASIC), a system-on-a-chip (SOC), a graphics processing unit (GPU), a programmable gate array (PGA), and so forth. Each one of these integrated circuit examples may include one or more pipeline stages. In addition, a given one of these integrated circuit examples may execute instructions from an instruction set architecture (ISA) distinct from another ISA executed by one or more other integrated circuits of the integrated circuit examples. In one example, a SOC includes multiple integrated circuit dies, wherein two or more of the dies execute instructions from distinct instruction set architectures (ISAs).

The integrated circuit 100 may be a die on a semiconductor wafer, a standalone packaged part, a packaged part within a printed circuit board (pcb), and so forth. The integrated circuit may use any available transistor technology. Examples may include at least complementary metal oxide semiconductor (CMOS) technology, transistor-to-transistor logic (TTL) technology, and bipolar junction transistor (BJT) technology. Additionally, the integrated circuit 100 may be included as one or more instantiations within one of the above examples, such as a GPU, a SOC, and so forth.

On-die process variation may cause spatially varying timing characteristics within the integrated circuit 100. In addition, process variation may cause varying timing characteristics between a given integrated circuit 100 and another integrated circuit of a same design on a same wafer. Similarly, process variation may cause varying timing characteristics between a given integrated circuit 100 and another integrated circuit of a same design on another wafer. The timing characteristics may include at least line delays of metal routes, gate delays, setup and hold times for sequential storage elements, operational clock frequency and clock duty cycle.

In one embodiment, each of the monitors 112a-112c is a timing characterization and self-test circuit. Each of the monitors 112a-112c may determine whether a respective physical region provides fast or slow timing characteristics relative to expected timing characteristics. Distributing the monitors 112a-112c across the die of the integrated circuit 100 may allow for efficient identification of regions with fast or slow timing characteristics across the integrated circuit 100. Identifying these regions may allow for speed binning at the time of production.

In addition to providing speed binning at the time of production, identifying fast or slow regions may allow for adjustments of performance-power operational states during operation of the integrated circuit 100. For example, when monitor 112a identifies region 110a with fast timing characteristics, a clock signal running within region 110a may run with a faster clock frequency than an expected frequency. Accordingly, an indication of the fast timing characteristics may be sent to an operating mode controller. This operating mode controller may be located within circuitry 114a. Alternatively, the operating mode controller may be located elsewhere within the integrated circuit 100. In response to receiving the indication, the operating mode controller may reduce a power supply voltage, $V_{dd}$, within the region 110a in some embodiments. The reduced power supply voltage may provide a same performance with less power consumption. In other embodiments, the operating mode controller may reduce the clock frequency of the clock signal supplied to the region 110a. However, this flexibility may not be available on the integrated circuit 110.

Each of the monitors 112a-112c may perform self-tests and calibrations in order to provide reliable results. For example, monitor 112a may include one or more tunable delay lines. These tunable delay lines may be tested prior to being used in timing measurements. Again, these timing measurements may include measurements for setup/hold times, clock duty cycle, and other timing values. A given tunable delay line within the monitor 112a may be set or tuned to an expected delay. A measurement of an actual delay for the tunable delay line may follow. The actual delay may be compared with the expected delay. In response to determining the actual delay of the tunable delay line is different from the expected delay by at least a given threshold amount, the monitor 112a may generate a scaling factor. The generated scaling factor may be a ratio of the actual measured delay to the expected delay. This scaling factor may be subsequently used during timing measurements. The monitors 112b-112c may perform self-tests and calibrations in a similar manner. Further details are provided below.

Figure 2:
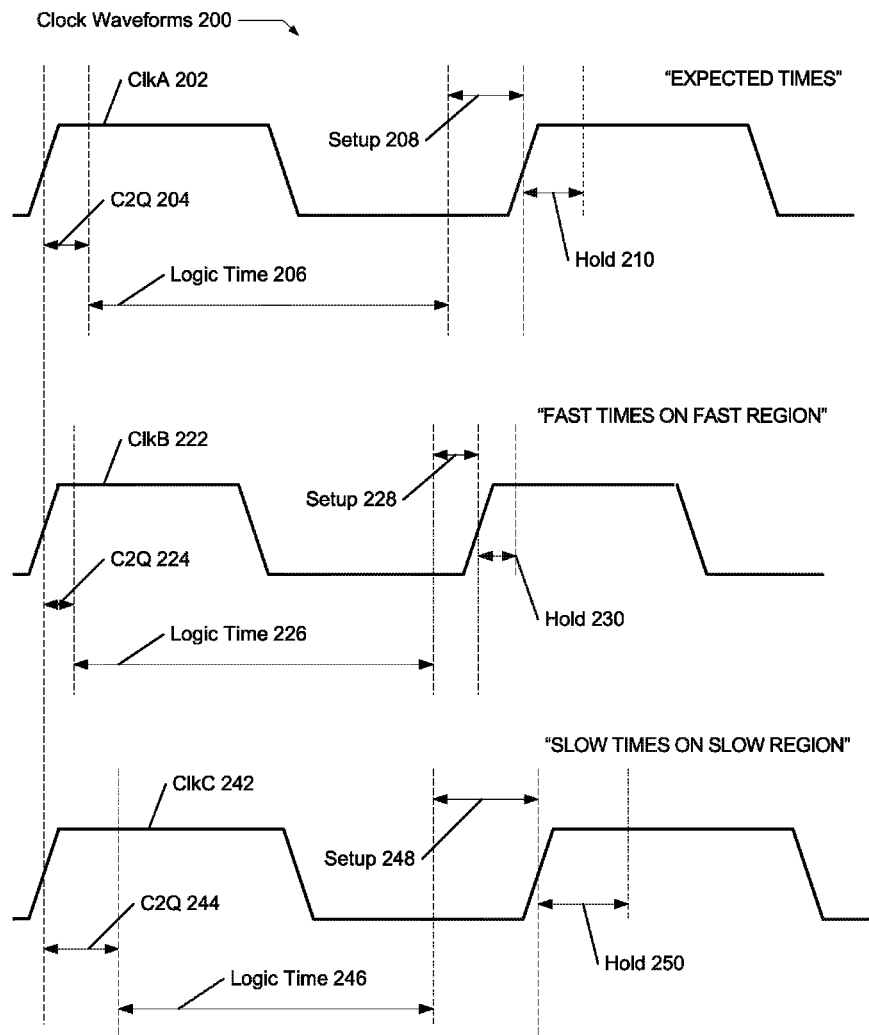
FIG. 2 is a generalized block diagram of one embodiment of clock waveforms.

Turning now to FIG. 2, a generalized block diagram illustrating one embodiment of clock waveforms 200 is shown. The clock waveforms 200 may be used for circuit techniques such as dynamic logic and for data storage in a sequential element. A sequential element used for data storage may include a flip-flop circuit, a single latch circuit, a random access memory (RAM) cell, a register file cell and so forth.

Three clock waveforms, ClkA 202, ClkB 222 and ClkC 242, are shown. The clock waveforms ClkB 222 and ClkC 242 are different versions of the clock waveform ClkA 202. Namely, ClkA 202 illustrates design or expected values for the clock waveform characteristics. These characteristics may include at least a clock frequency, duty cycle, rise and fall times, setup time and a hold time. The waveform ClkB 222 illustrates an actual clock waveform with these design values as input to a physical region with process variations that cause faster timing characteristics. The waveform ClkC 242 illustrates an actual clock waveform with these design values as input to a physical region with process variations that cause slower timing characteristics.

The setup time defines time duration for a data input signal on a data input line of a sequential element to remain stable. As shown, this minimum time duration may be prior to the rise of the clock signal for a positive-edge triggered sequential element. This minimum time duration may be prior to the fall of a clock signal for a negative-edge triggered sequential element. This duration may be defined by the delay of an inverter supplying the inverted input data value to a master transmission-gate and the delay of the master transmission-gate. Another delay value may be used if other circuitry is used other than an inverter and a transmission gate. If the data input signal is not stable for the setup duration prior to the clock rising for a positive-edge sequential element, then the input data value may not have time to be stored by a master latch.

A sequential element may have an expected setup time, Setup 208, shown in waveform ClkA 202. On a region with fast times due to process variation and/or device aging, a sequential element may have a setup time, Setup 228, shown in waveform ClkB 222. The setup time, Setup 228, may be smaller than the expected setup time, Setup 208. In one example, an inverter and a transmission gate may have smaller delays due to process variation and/or device aging, which cause the smaller setup time, Setup 228. On a region with slow times due to process variation and/or device aging, a sequential element may have a setup time, Setup 248, shown in waveform ClkC 242. The setup time, Setup 248, may be larger than the expected setup time, Setup 208. In one example, an inverter and a transmission gate may have larger delays due to process variation and/or device aging, which cause the larger setup time, Setup 248.

The hold time also defines time duration a signal on a data input line of a sequential element to remain stable. As shown, this minimum time duration may be subsequent to the rise of the clock signal for a positive-edge triggered sequential element. This minimum time duration may be after the fall of a clock signal for a negative-edge triggered sequential element. This duration may be defined by circuitry following gates that receive the clock signal and pass the received data input to internal nodes of the sequential element. For example, a transmission gate and at least another inverter may define the delay used for the hold time. If the data input signal is not stable for the minimum hold duration subsequent to the clock rising, then an erroneous input data value may have time to overwrite the correct value to be stored by the sequential element.

A sequential element may have an expected hold time, Hold 210, shown in waveform ClkA 202. On a region with fast times due to process variation and/or device aging, a sequential element may have a hold time, Hold 230, shown in waveform ClkB 222. The hold time, Hold 230, may be smaller than the expected hold time, Hold 210. In one example, an inverter and a transmission gate may have smaller delays due to process variation and/or device aging, which cause the smaller hold time, Hold 230. On a region with slow times due to process variation and/or device aging, a sequential element may have a hold time, Hold 250, shown in waveform ClkC 242. The hold time, Hold 250, may be larger than the expected hold time, Hold 210. In one example, an inverter and a transmission gate may have larger delays due to process variation and/or device aging, which cause the larger hold time, Hold 250.

A sequential element may have a clock-to-Q propagation value, which represents a delay between the time the clock signal rises and the output of the sequential element is present on its output line. In one example, this delay may be due to the propagation delay of a slave latch. The delay of the slave latch may include an inverter delay to present an inverted clock signal to the slave latch, the inverter delay to supply the input value to the slave transmission-gate, the delay through the transparent slave transmission-gate, and the inverter output buffer delay. Not all of these delays are accumulated as separate values, since some of the delays may occur simultaneously such as the inverter delay for the clock signal and the inverter delay for the slave latch input.

A sequential element may have an expected clock-to-Q propagation value, C2Q 204, shown on waveform ClkA 202. Similar to the setup and hold times described in the above description, process variation and/or device aging may cause the clock-to-Q propagation value to differ in particular regions from the expected value, C2Q 204. For example, the waveform ClkB 222 in a fast region has a smaller clock-to-Q propagation value, C2Q 224. In another example, the waveform ClkC 242 in a slow region has a larger clock-to-Q propagation value, C2Q 244. Similarly, the duty cycles of each of the waveforms ClkB 222 and ClkC 242 may differ from the duty cycle of the expected waveform ClkA 202. Likewise, a time for computations and routing signals, such as the expected logic time 206 for waveform ClkA 202, may differ for each of the waveforms ClkB 222 and ClkC 242. Due to process variation and/or device aging, the gate delays and wire route delays for the fast region may be smaller than expected delays. Similarly, the gate delays and wire route delays for the slow region may be larger than expected delays.

Referring now to FIG. 3, a generalized block diagram of one embodiment of a parameter table 300 is shown. The parameter table 300 may store measured parameter values across a die of an integrated circuit. In one embodiment, the table 300 may store measured values for multiple processor corners. In other embodiments, a separate table may be used for one or more process corners. In one embodiment, the table 300 is included in the integrated circuit 100. In another embodiment, the table 300 is included in one of the monitors 112*a*-112*c* the monitor. In yet another embodiment, the table 300 in located outside of the integrated circuit 100, such as a system controller in a SOC.

Dies of an integrated circuit design that are not defective, but provide different measured parameters from expected parameter values may be placed in different bins according to the measured parameters. For example, speed binning may categorize dies based on maximum operational frequency. In addition, the environment an IC will be used may be determined by at least current values of leakage current for a given performance-power state. The table 300 may be used to categorize one or more dies of an integrated circuit and to determine how to distribute the dies to market. Additionally, the measured values in table 300 may alter the control logic in at least a performance-power controller. The control logic may change to provide more efficient performance based on actual measured values, rather than expected values.

As described above, the table 300 may be used at a time of testing and at a later time of production for an integrated circuit design. In addition, reliably characterizing spatially varying speeds on a given die over time of use may allow for tuning of performance-power states on the given die of the IC. When the IC has been in use for a given amount of time, device aging may affect the previously measured parameters. In one embodiment, an operating system or other software may determine a given amount of time has passed while the IC has been in use. Indications to run timing characterizations and self-tests may be sent to the monitors 112*a*-112*c* to provide updated values for the parameter values.

In one embodiment, the table 300 has multiple entries 302*a*-302*g*. Each entry may include several fields. In one example, an entry includes a field 304 that stores a process corner identifier (ID), a field 306 that stores a region ID, and a field 308 that stores a maximum clock frequency for a given region identified by the region ID. For the given region identified by the region ID stored in field 306, other parameters may be measured, such as an average amount of leakage current, a ring oscillator count in a given test period, measured setup and hold times for a given sequential element, a clock duty cycle, and one or more tunable delay scaling factors. These parameters may be stored in fields 310-322. A region ID stored in field 324 may identify another region. In another embodiment, parameters for another region may be stored in a separate entry.

The monitors 112*a*-112*c* may perform a self-test to verify one or more included tunable delay lines. When a measured delay of one or more tunable delays lines are found to deviate from an expected delay, a scaling factor may be generated to correct the deviating tunable delay lines for timing measurements. Therefore, a higher accuracy may be achieved for the setup, hold, duty cycle and other timing measurements performed by the monitors 112*a*-112*c*.

Figure 4:
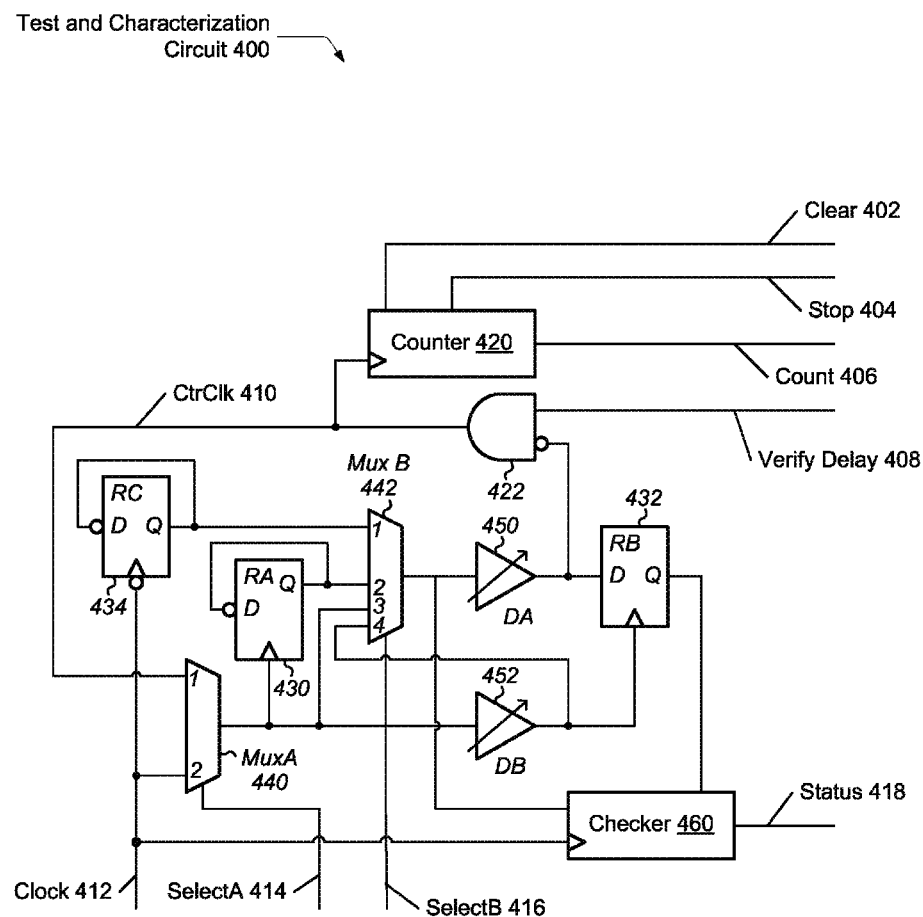
FIG. 4 is a generalized block diagram illustrating one embodiment of a timing characterization and self-test circuit.

Referring now to FIG. 4, a generalized block diagram of one embodiment of a timing characterization and self-test circuit 400 is shown. Each of the monitors 112*a*-112*c* may include the circuit 400. As shown, the circuit 400 may receive control signals, such as clear 402 and stop 404 to control a counter 420; a verify delay signal 408 to begin a verification test for one or more tunable delay lines, such as DA 450 and DB 452; a clock signal 412; and select lines SelectA 14 and SelectB 416 for the multiplexers (muxes) MuxA 440 and MuxB 442. The tunable delay lines DA 450 and DB 452 may utilize any suitable implementation and technology.

The logic gate 422 may receive the control signal verify delay 408 and an output of a tunable delay line, such as DA 450. The logic gate 422 may invert the output of the tunable delay line DA 450 and perform a binary AND combination with the control signal verify delay 408. The output of the logic gate 422, which is indicated as CtrClk 410 may be sent to each of the counter 420 and the MuxA 440.

In one embodiment, during a verification test of the tunable delay line DA 450, the verify delay signal 408 may be asserted with a logic high value. The SelectA value 414 may be set to 1 in order for MuxA 440 to select the CtrClk 410 value as its input to provide on its output. The SelectB value 416 may be set to 3 in order for MuxB 442 to provide the output of MuxA 440 on its output. The output of MuxB 442 is sent to the tunable delay line DA 450. The output of the tunable delay line DA 450 is sent to the logic gate 422 and the cyclic signal path repeats. A measured count by the counter 420 may be later compared to an expected count after a given test period.

In one embodiment, during a verification test of the tunable delay line DB 452, the verify delay signal 408 may again be asserted with a logic high value. The SelectA value 414 may be set to 1 in order for MuxA 440 to select the CtrClk 410 value as its input to provide on its output. The SelectB value 416 may be set to 4 in order for MuxB 442 to provide the output of the tunable delay line DB 452 on its output. The output of MuxB 442 is sent to the tunable delay line DA 450. The output of the tunable delay line DA 450 is sent to the logic gate 422 and the cyclic signal path repeats. The delay of the cyclic signal path is proportional to the series combination of the tunable delay lines DA 450 and DB 452. A measured count by the counter 420 may be later compared to an expected count after a given test period.

The counts for one or more tests for the tunable delay lines DA 450 and DB 452 may be sent to control logic within each of the monitors 112*a*-112*c*. The control logic may determine whether the measured counts are within given tolerances of expected counts. If the measured counts deviate from the expected counts by more than a given threshold, then a scaling factor for one or both of the tunable delay lines DA 450 and DB 452 may be generated. The scaling factors may be used for subsequent timing measurements, such as at least setup, hold and duty cycle measurements. A description of the timing measurements is provided shortly. First, signal waveforms are described for the verification tests for the tunable delay lines DA 450 and DB 452. In one embodiment, the tunable delay lines DA 450 and DB 452 utilize a non-inverting configuration. In other embodiments, an inverting configuration may be used.

In one embodiment, the signal verify delay 408 is asserted to a logic high value for verification tests of the tunable delay lines DA 450 and DB 452. During subsequent timing measurements, the signal verify delay 408 may be deasserted to a logic low value. As further described below, the circuit 400 may convert the clock period of clock signal 412 to a delay count value using the tunable delay chains DA 450 and DB 452. The flip-flops RA 430 and RC 434 may be used to launch a transition, which is captured by the flip-flop RB 432. The mux 442 may determine which source flip-flop is used.

Test logic that is not shown may control the tunable delay lines DA 450 and DB 452. Each of the flip-flops 430-434 may have scan circuitry and multiple data output lines, which is not shown for ease of illustration. The checker 40 may compare the outputs of the flip-flops 430-434 and additionally may keep statistics. The metal routes used for wiring the signals may be performed to match delays and reduce a source of errors. The circuit 400 may utilize a minimal amount of components and wiring to keep accuracy high and a source of defects low.

Figure 5:
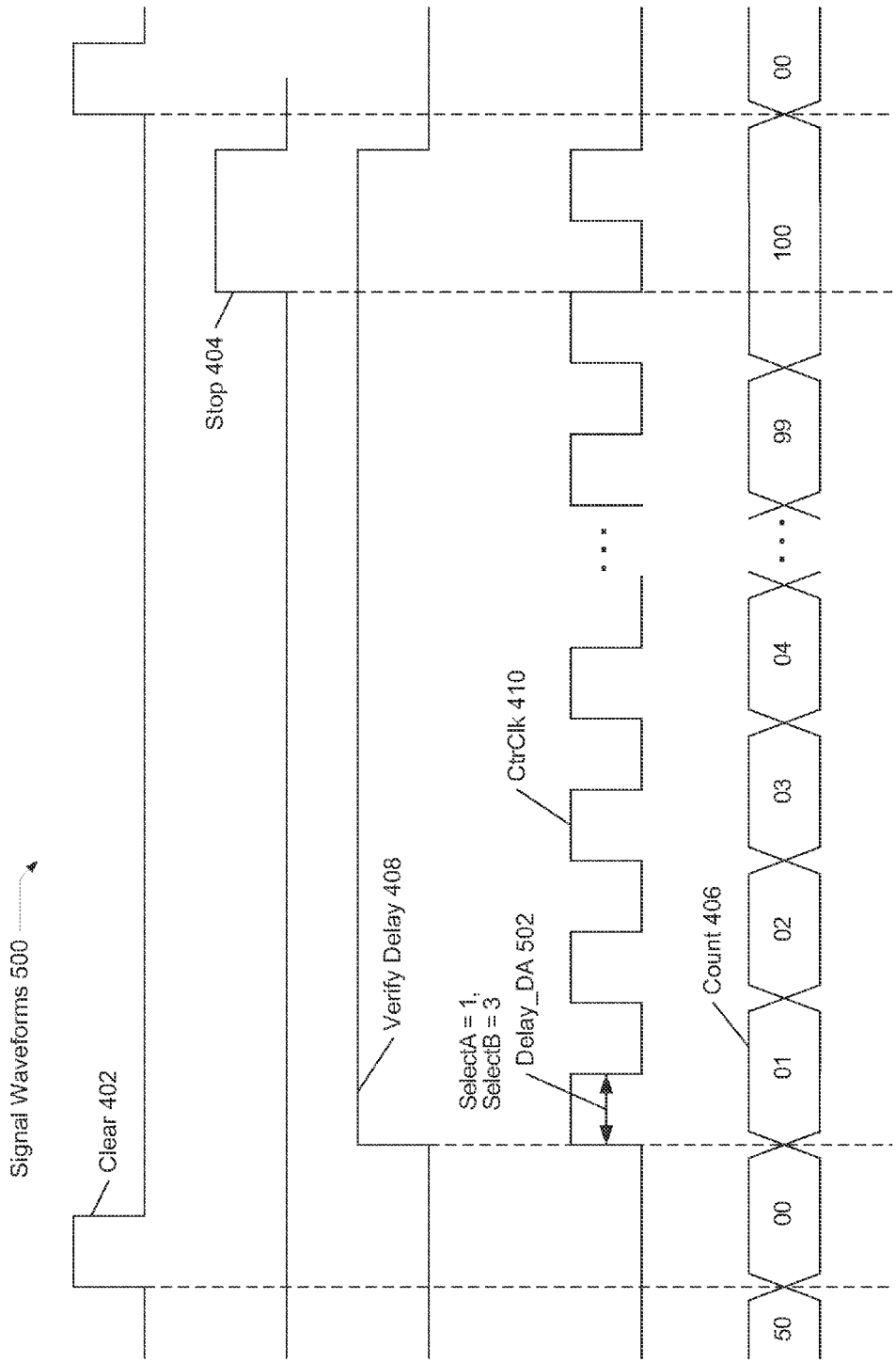
FIG. 5 is a generalized flow diagram illustrating one embodiment of test signal waveforms.

Turning now to FIG. 5, a generalized block diagram illustrating one embodiment of test signal waveforms 500 is shown. As shown, the test may begin by clearing the counter 420 with the signal Clear 402. At a same time or shortly after Clear 402 is asserted, the signal Verify Delay 404 may be asserted to a logic high value. The signal CtrClk 410 begins toggling.

With the circuit implementation shown in the circuit 400, the signal CtrClk 410 may toggle approximately after a tuned delay of the tunable delay line DA 450. This delay is shown as Delay_DA 502. The select values SelectA 414 and 416 may be set to 1 and 3, respectively. The counter 420 may increment by each rising edge of the signal CtrClk 410. Knowing the approximate delays of the wire routes, the muxes MuxA 440 and MuxB 442, the logic gate 422, and the tuned delay of the tunable delay line DA 450, an expected count may be derived for a given test period between the assertion of the signal Verify Delay 408 and the signal Stop 404. The measured count on the count signal 406 may be compared to the expected count as described earlier.

Figure 6:
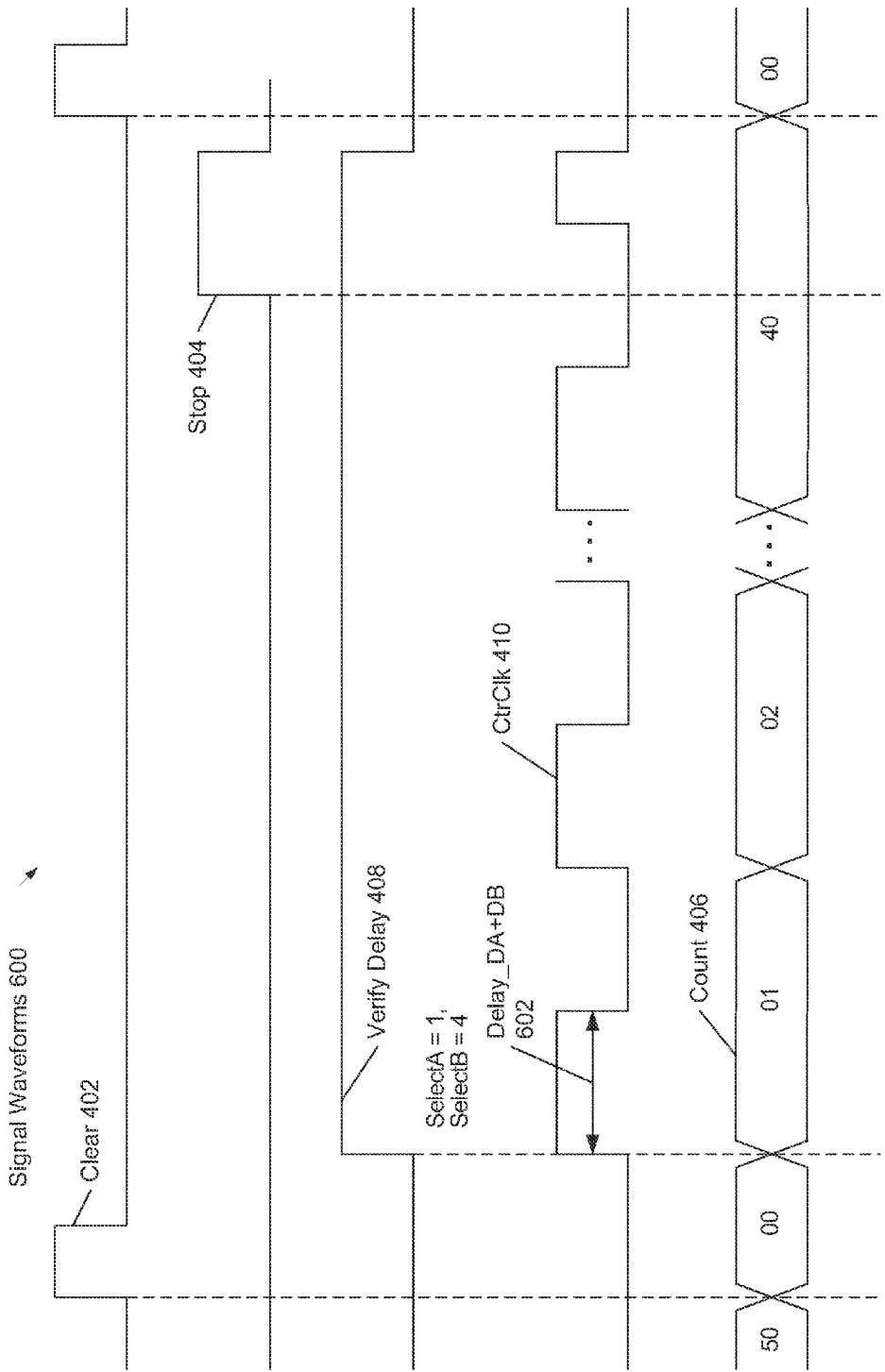
FIG. 6 is a generalized block diagram illustrating another embodiment of test signal waveforms.

Turning now to FIG. 6, a generalized block diagram illustrating another embodiment of test signal waveforms 600 is shown. As shown, the test may begin by clearing the counter 420 with the signal Clear 402. At a same time or shortly after Clear 402 is asserted, the signal Verify Delay 404 may be asserted to a logic high value. The signal CtrClk 410 begins toggling.

With the circuit implementation shown in the circuit 400, the signal CtrClk 410 may toggle approximately after a tuned delay of the series combination of the tunable delay line DA 450 and the tunable delay line DB 452. This delay is shown as Delay_DA+DB 602. The select values SelectA 414 and 416 may be set to 1 and 4, respectively. The counter 420 may increment by each rising edge of the signal CtrClk 410. Knowing the approximate delays of the wire routes, the muxes MuxA 440 and MuxB 442, the logic gate 422, and the tuned delays of the tunable delay lines DA 450 and DB 452, an expected count may be derived for a given test period between the assertion of the signal Verify Delay 408 and the signal Stop 404. In addition, a scaling factor for the tunable delay line DA 450 may be used. This scaling factor may have been determined after the test shown in FIG. 5. The measured count on the count signal 406 may be compared to the expected count as described earlier.

Figure 7:
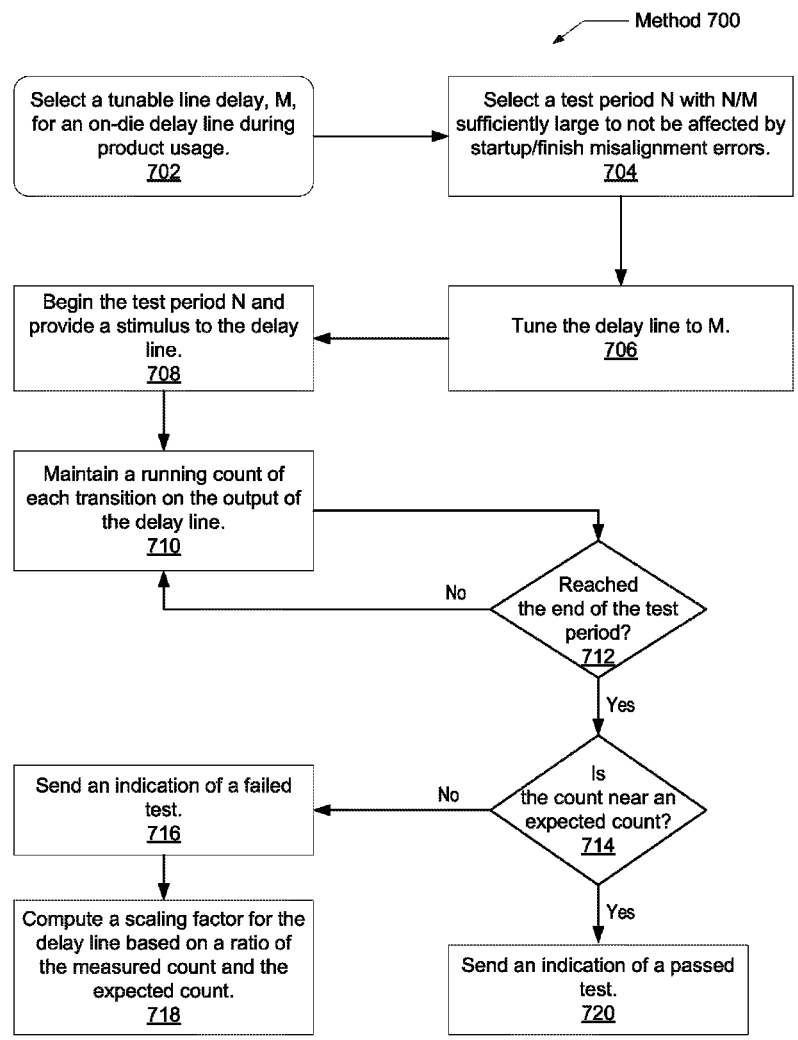
FIG. 7 is a generalized flow diagram illustrating one embodiment of a method for verifying a tunable delay line.

Referring now to FIG. 7, a generalized flow diagram of one embodiment of a method 700 for verifying a tunable delay line is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 702, a tunable line delay, M, is selected for a given tunable delay line. The tunable delay line may be located within an on-die timing characterization and self-test circuit as shown in FIG. 4. This circuit may be located in a monitor with copies of the monitor distributed across the die of a given integrated circuit. The selection of the line delay, M, and subsequent test described shortly may be performed while the die is in use in a product, rather than during a test and production phase of development.

In block 704, a test period N is selected with the ratio N/M sufficiently large to not be affected by startup/finish misalignment errors. In block 706, the tunable delay line under test may be tuned to the selected delay M. In block 708, a stimulus may be provided to the tunable delay line under test and the test period N may begin. In one embodiment, the output of the logic gate 422 and MuxA 440 provides the stimulus to the tunable delay line DA 450.

In block 710, a running count of each transition on the output of the delay line may be maintained. If the end of the test period N is reached (conditional block 712), and if the maintained count is determined to be within a given threshold of an expected count (conditional block 714), then in block 720, an indication of a passed test may be sent to control logic. No scaling factor may be generated. A subsequent test may be started, which may use tuned delays provided by the verified tunable delay line. In one embodiment, an expected count may be a ratio N/M.

In one embodiment, a difference may be determined between an actual delay through the delay line and an expected delay used to set the delay line at the beginning of the test. If the difference is greater than a given threshold, then the test may be considered to fail. In one embodiment, the maintained count and an expected count may be used to determine the respective delays. If the maintained count is determined to not be within a given threshold of an expected count (conditional block 714), then in block 716, an indication of a failed test may be sent to control logic. In block 718, a scaling factor may be generated. In one embodiment, the maintained count and the expected count may be used to generate the scaling factor. For example, a ratio of the maintained count and the expected count may be used to generate the scaling factor. A subsequent test may be started, which may use tuned delays provided by the tested tunable delay line. The tuned delays may utilize the generated scaling factor.

Figure 8:
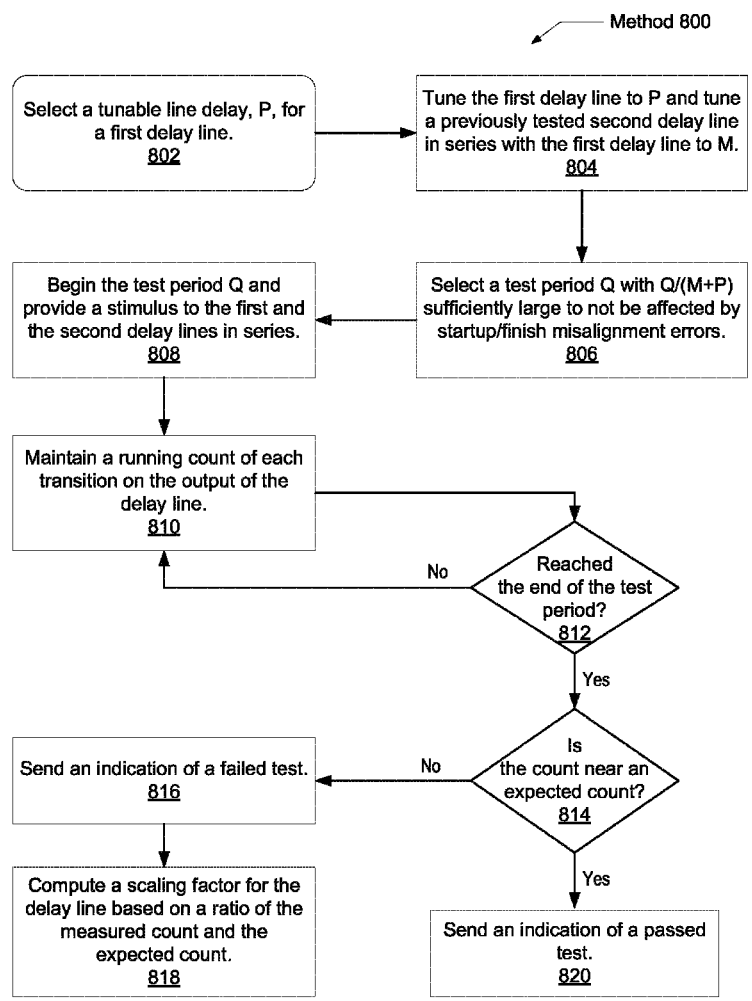
FIG. 8 is a generalized flow diagram illustrating another embodiment of a method for verifying a tunable delay line.

Turning now to FIG. 8 a generalized flow diagram of another embodiment of a method 800 for verifying a tunable delay line is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 802, a tunable line delay, P, is selected for a given tunable delay line. The tunable delay line may be located within a timing characterization and self-test circuit as shown in FIG. 4. This circuit may be located in a monitor with copies of the monitor distributed across the die of a given integrated circuit. This tunable delay line may be a tunable delay line to be verified after one or more other tunable delay lines have already been tested. In block 804, a previously tested tunable delay line may be tuned to a delay M. The current tunable delay line under test may be tuned to the selected delay P. At least these two tunable delay lines may be in a series combination.

In block 806, a test period Q is selected with the ratio Q/(M+P) sufficiently large to not be affected by startup/finish misalignment errors. In block 706, the tunable delay line under test may be tuned to the selected delay M. In block 808, a stimulus may be provided to the tunable delay line under test and the test period Q may begin. In one embodiment, the output of the logic gate 422 and MuxA 440 provides the stimulus to the tunable delay line DB 452.

In block 810, a running count of each transition on the output of the series combination of the tunable delay lines with tuned delays M and P, respectively, may be maintained. If the end of the test period Q is reached (conditional block 812), and if the maintained count is determined to be within a given threshold of an expected count (conditional block 814), then in block 820, an indication of a passed test may be sent to control logic. No scaling factor may be generated. A subsequent test may be started, which may use tuned delays provided by the verified tunable delay line. In one embodiment, an expected count may be a ratio Q/(M+P).

If the maintained count is determined to not be within a given threshold of an expected count (conditional block 814), then in block 816, an indication of a failed test may be sent to control logic. A scaling factor may be generated. The maintained count and the expected count may be used to generate the scaling factor. A subsequent test may be started, which may use tuned delays provided by the tested tunable delay line. The tuned delays may utilize the generated scaling factor.

Figure 9:
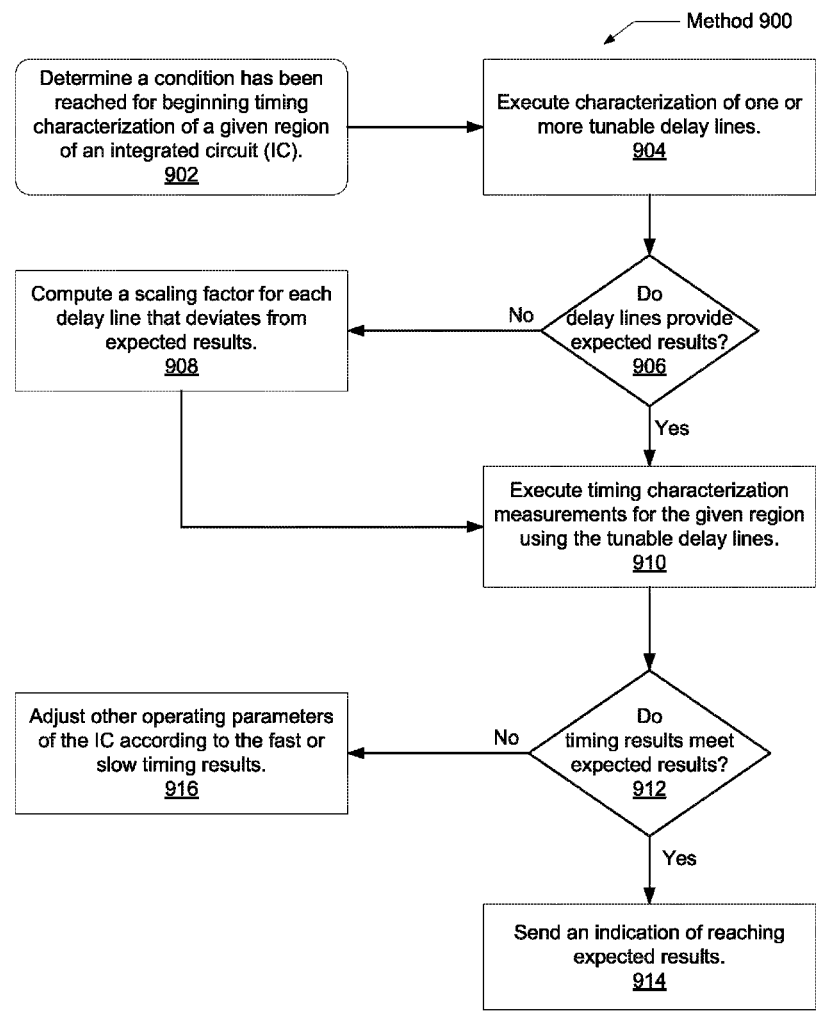
FIG. 9 is a generalized flow diagram illustrating one embodiment of a method for detecting and reacting to timing variations on an IC.

Referring now to FIG. 9 a generalized flow diagram of one embodiment of a method 900 for detecting and reacting to timing variations on an IC is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 902, a determination is made that a condition has been reached for beginning timing characterization of a given region of an integrated circuit (IC). In one embodiment, the condition may be an operating system or other software may determine a given time period of use of the IC has elapsed. In block 904, characterization of one or more tunable delay lines may be executed. For example, verification of the tunable delay lines within distributed monitors 112a-112c may be performed. The circuit, waveforms and methods described in the above descriptions may be used.

If one or more of the tunable delay lines do not provide expected results (conditional block 906), then in block 908, a respective scaling factor may be generated for each identified tunable delay line. In block 910, timing characterization measurements may be executed for the given region using the tunable delay lines and any respective scaling factors. Examples of timing characterization measurements include at least setup and hold times and duty cycle times.

If the timing results meet expected timing values within a given threshold (conditional block 912), then in block 914, an indication of reaching expected results may be sent to respective control logic within the monitors 112a-112c. No adjustments to other operating parameters for the IC may be made based on fast or slow timing results. However, if the timing results do not meet expected timing values within a given threshold (conditional block 912), then in block 916, other operating parameters for the IC may be adjusted based on the fast or slow timing results. For example, a region with fast results may have an operating power supply voltage reduced to provide similar performance with a smaller power supply voltage.

Figure 10:
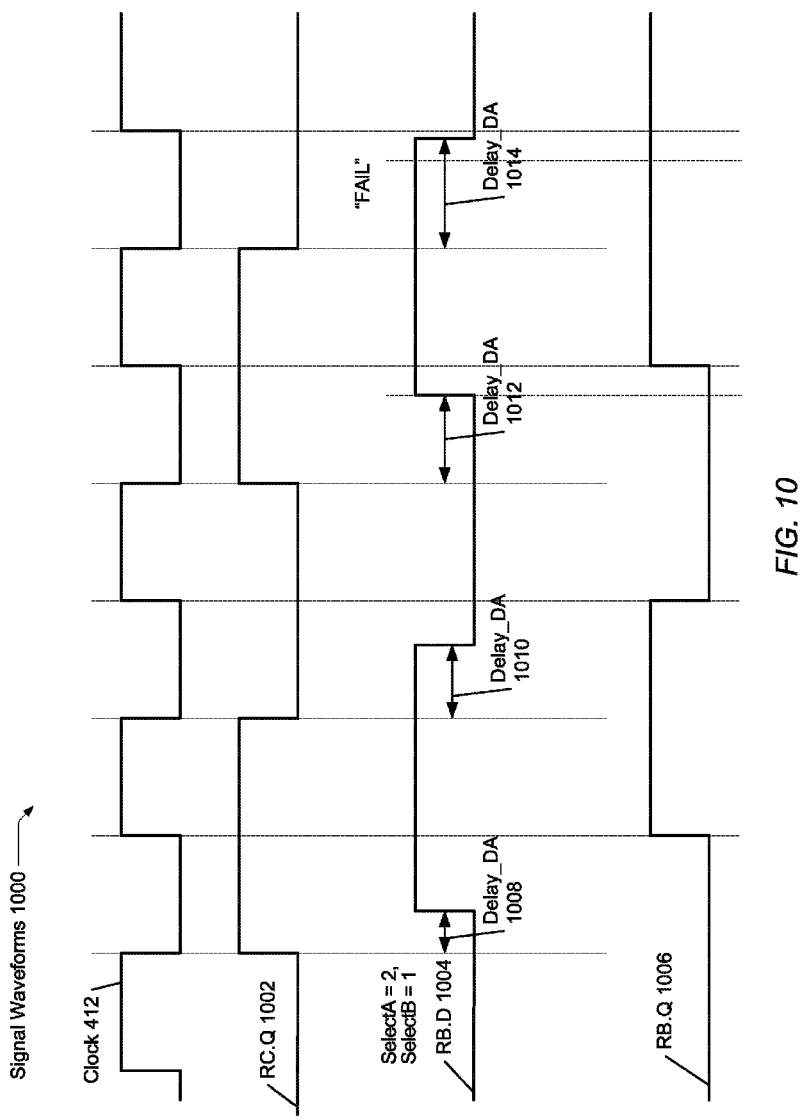
FIG. 10 is a generalized block diagram illustrating one embodiment of test signal waveforms for a setup time measurement.

Turning now to FIG. 10, a generalized block diagram illustrating one embodiment of test signal waveforms 1000 for a setup time measurement is shown. As shown, a tunable delay may continue to increase by incremental steps from Delay_DA 1008 to Delay_DA 1014 until a failed condition is detected. The failed condition may be a data input signal is not stored by a given sequential element.

With the circuit implementation shown in the circuit 400, the flip-flop RC 434 may receive the clock signal 412. The flip-flop RC 434 may be a negative-edge triggered flip-flop. The select values SelectA 414 and 416 may be set to 2 and 1, respectively. The tunable delay line DB 452 may be set to a minimal delay value. The data input on the flip-flop RB 432 may receive the toggling output of the flip-flop RC 434 after the delays of the clock-to-Q propagation of the flip-flop RC 434, the MuxB 442 and the tunable delay line DA 450. The tunable delay line DA 450 may have its delay incremented until the flip-flop RB 432 is unable to store the output from the flip-flop RC 434. The corresponding delay, shown as Delay_DA 1014, may be proportional to the setup time of the flip-flop RB 432. The checker 460 may verify a successful capture and storage and provide a corresponding indication the output line status 418.

Figure 11:
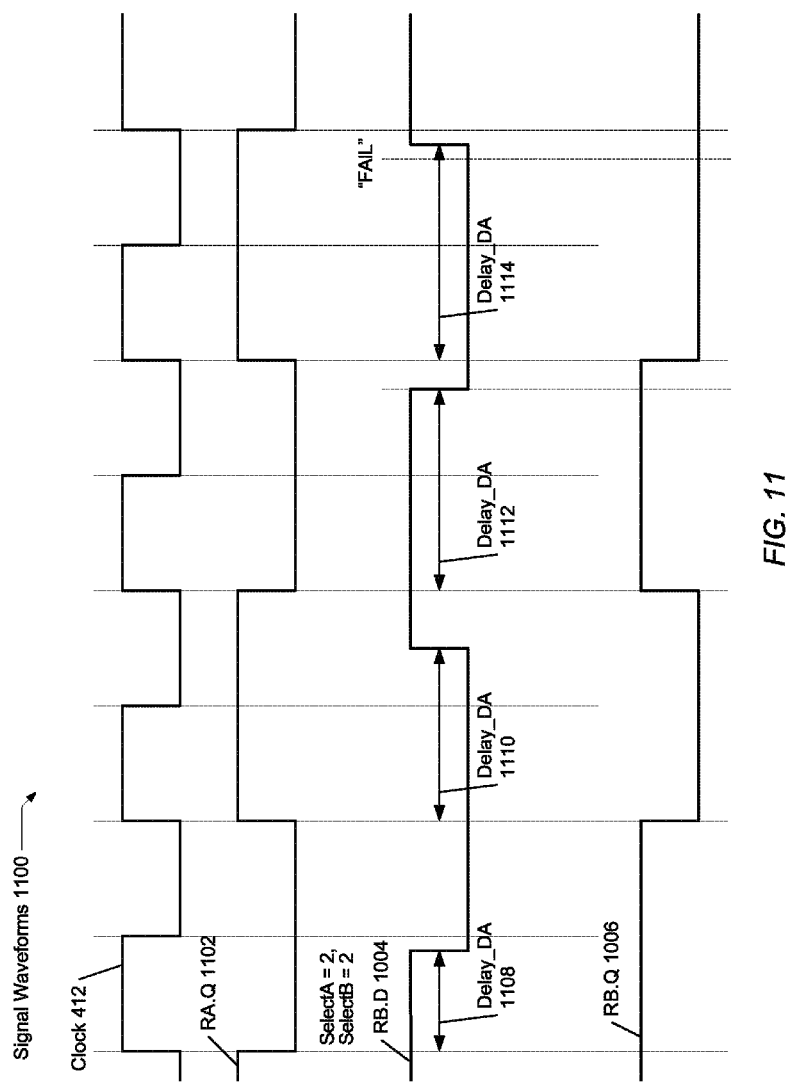
FIG. 11 is a generalized block diagram illustrating another embodiment of test signal waveforms for a setup time measurement.

Turning now to FIG. 11, a generalized block diagram illustrating another embodiment of test signal waveforms 1100 for a setup time measurement is shown. As shown, a tunable delay may continue to increase by incremental steps from Delay_DA 1108 to Delay_DA 1114 until a failed condition is detected. The failed condition may be a data input signal is not stored by a given sequential element.

With the circuit implementation shown in the circuit 400, the flip-flop RA 430 may receive the clock signal 412. The flip-flop RA 430 may be a positive-edge triggered flip-flop. The select values SelectA 414 and 416 may be set to 2 and 2, respectively. Similar to the test above, the tunable delay line DB 452 may be set to a minimal delay value. Also similar to the above test, the clock signal 412 may be supplied to the flip-flop RB 43 via MuxA 440 and the tunable delay line DB 452.

The data input on the flip-flop RB 432 may receive the toggling output of the flip-flop RA 430 after the delays of the clock-to-Q propagation of the flip-flop RA 430, the MuxB 442 and the tunable delay line DA 450. The tunable delay line DA 450 may have its delay incremented until the flip-flop RB 432 is unable to store the output from the flip-flop RA 430. The corresponding delay, shown as Delay_DA 1014, may be proportional to the setup time of the flip-flop RB 432. The checker 460 may verify a successful capture and storage and provide a corresponding indication the output line status 418. In addition, the tests using the signal waveforms 1000 and 1100 may be used to determine a duty cycle for the clock 412. This computed value may be compared to an expected value.

Figure 12:
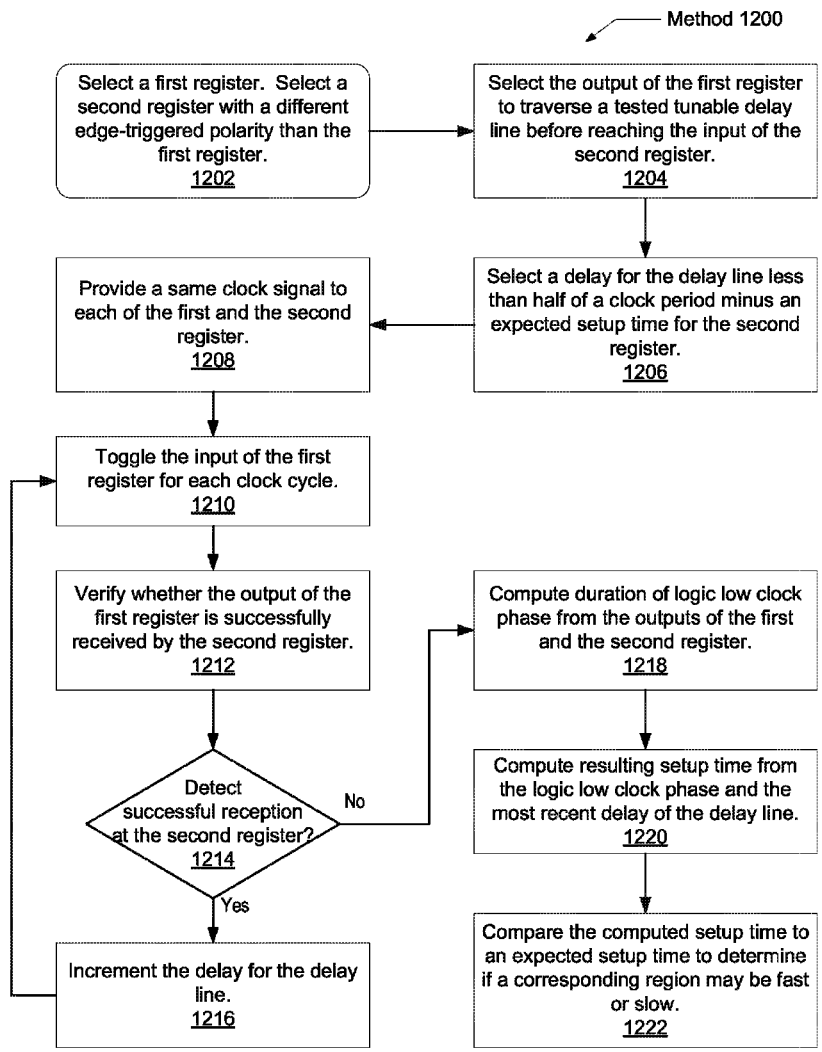
FIG. 12 is a generalized flow diagram illustrating one embodiment of a method for measuring a setup time for a given region of an integrated circuit (IC).

Referring now to FIG. 12, a generalized flow diagram of one embodiment of a method 700 for measuring a setup time for a given region of an IC is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 1202, a first register is selected. In one embodiment, the first register may be a flip-flop circuit. A second register may be selected with a different edge-triggered polarity than the first register. For example, the first register may be a negative-edge triggered flip-flop and the second register is a positive-edge triggered flip-flop. In block 1204, the data output of the first register may be selected to traverse a tested tunable delay line before reaching the data input of the second register. In block 1206, a delay for the delay line may be selected to be less than half of a clock period minus an expected setup time for the second register. In addition, a scaling factor may be used to adjust the setting of the delay for the delay line. The steps described earlier for methods 700-900 may be used to determine a scaling factor. For example, during an earlier verification test may determine the delay line is slow due to defects and aging effects. The delay line may provide a delay that is double an expected delay in one example. Therefore, during timing characterization, the delay used to set the delay line may be halved by the scaling factor in order to achieve the expected delay for the characterization measurement.

In block 1208, a same clock signal may be provided to each of the first and the second register. In block 1210, the data input of the first register may be toggled for each clock cycle. In block 1212, whether the second register successfully receives the output of the first register may be verified. If the second register successfully receives the output of the first register (conditional block 1214), then in block the delay may be incremented by a given step value. Control flow of method 1200 may then return to block 1210.

If the second register does not successfully receive the output of the first register (conditional block 1214), then in block 1218, the duration of a logic low clock phase from the outputs of the first and the second register may be computed. In block 1220, the resulting setup time may be computed from the logic low clock phase and the most recent delay of the delay line. In block 1222, the computed setup time may be compared to an expected setup time to determine if a corresponding region may be fast or slow. This result may be conveyed to control logic within the distributed monitors 112a-112c.

Figure 13:
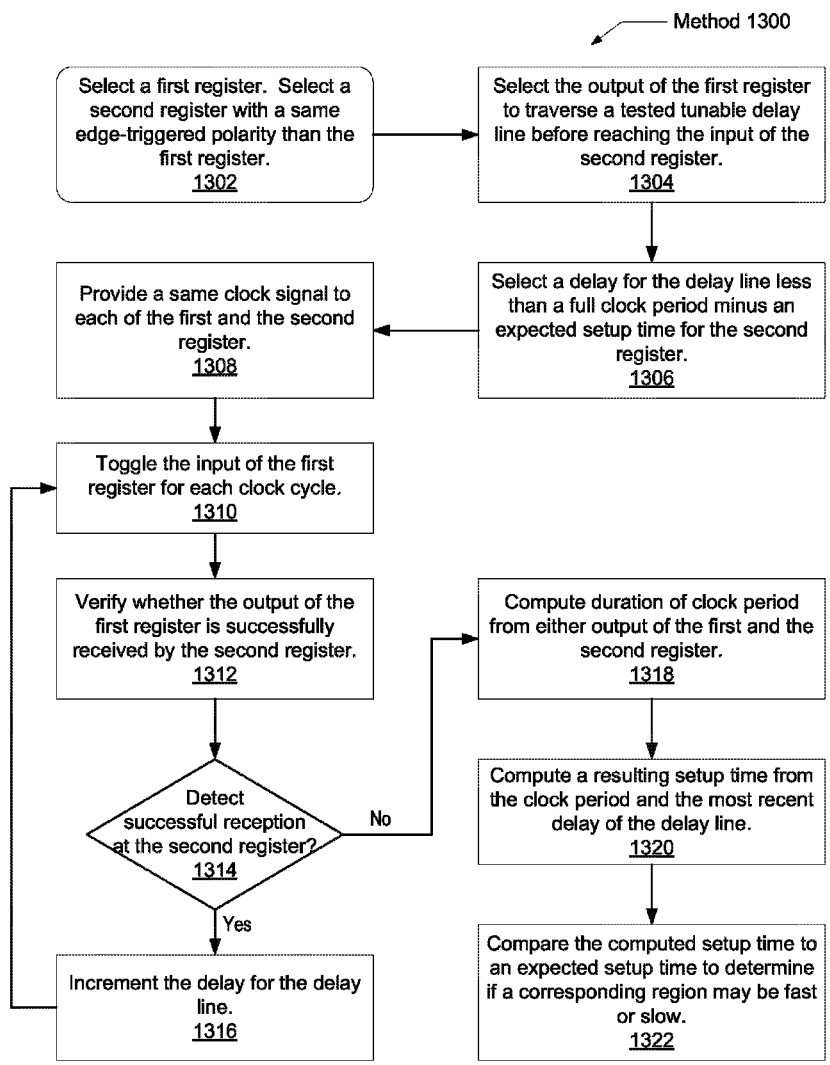
FIG. 13 is a generalized flow diagram illustrating another embodiment of a method 1300 for measuring a setup time for a given region of an IC.

Referring now to FIG. 13, a generalized flow diagram of another embodiment of a method 1300 for measuring a setup time for a given region of an IC is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 1302, a first register is selected. In one embodiment, the first register may be a flip-flop circuit. A second register may be selected with a same edge-triggered polarity as the first register. For example, the first register may be a positive-edge triggered flip-flop and the second register is a positive-edge triggered flip-flop. The steps 1304-1322 may be performed in a similar manner as the steps 1204-1222 discussed in the above description for method 1200. However, the measured setup time may be computed in block 1320 using the clock period, rather than the logic low clock phase.

Figure 14:
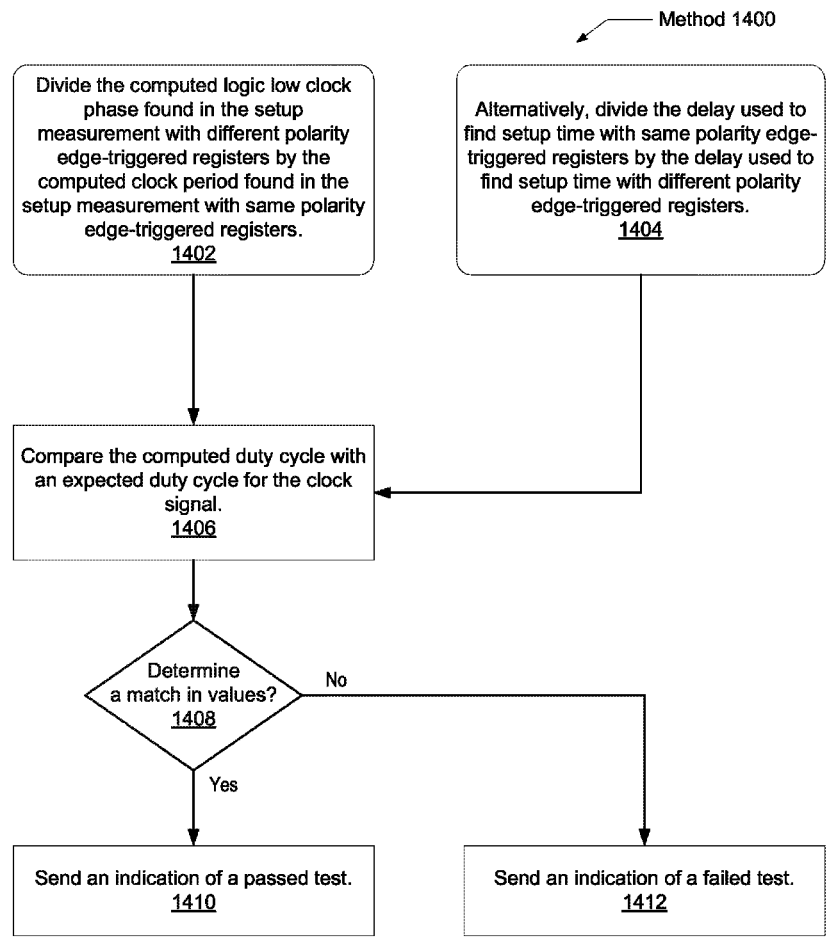
FIG. 14 is a generalized flow diagram illustrating one embodiment of a method for measuring a duty cycle for a given region of an IC.

Referring now to FIG. 14, a generalized flow diagram of one embodiment of a method 1400 for measuring a duty cycle for a given region of an IC is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 1402, the computed logic low clock phase found in the setup measurement with different polarity edge-triggered registers may be divided by the computed clock period found in the setup measurement with same polarity edge-triggered registers. These two values may be found with methods 1200 and 1300, respectively. Alternatively, in block 1404, the delay used to find the setup time with same polarity edge-triggered registers may be divided by the delay used to find the setup time with different polarity edge-triggered registers. These two values may be found with methods 1300 and 1200, respectively.

In block 1406, the computed duty cycle may be compared with an expected duty cycle for the clock signal. If a match is found between the two values (conditional block 1408), then in block 1410, an indication of a passed test may be sent to control logic within the distributed monitors 112a-112c. A match may be determined in response to a difference between the two values is within a given tolerance or threshold. If a match is not found between the two values (conditional block 1408), then in block 1412, an indication of a failed test may be sent to control logic within the distributed monitors 112a-112c.

Figure 15:
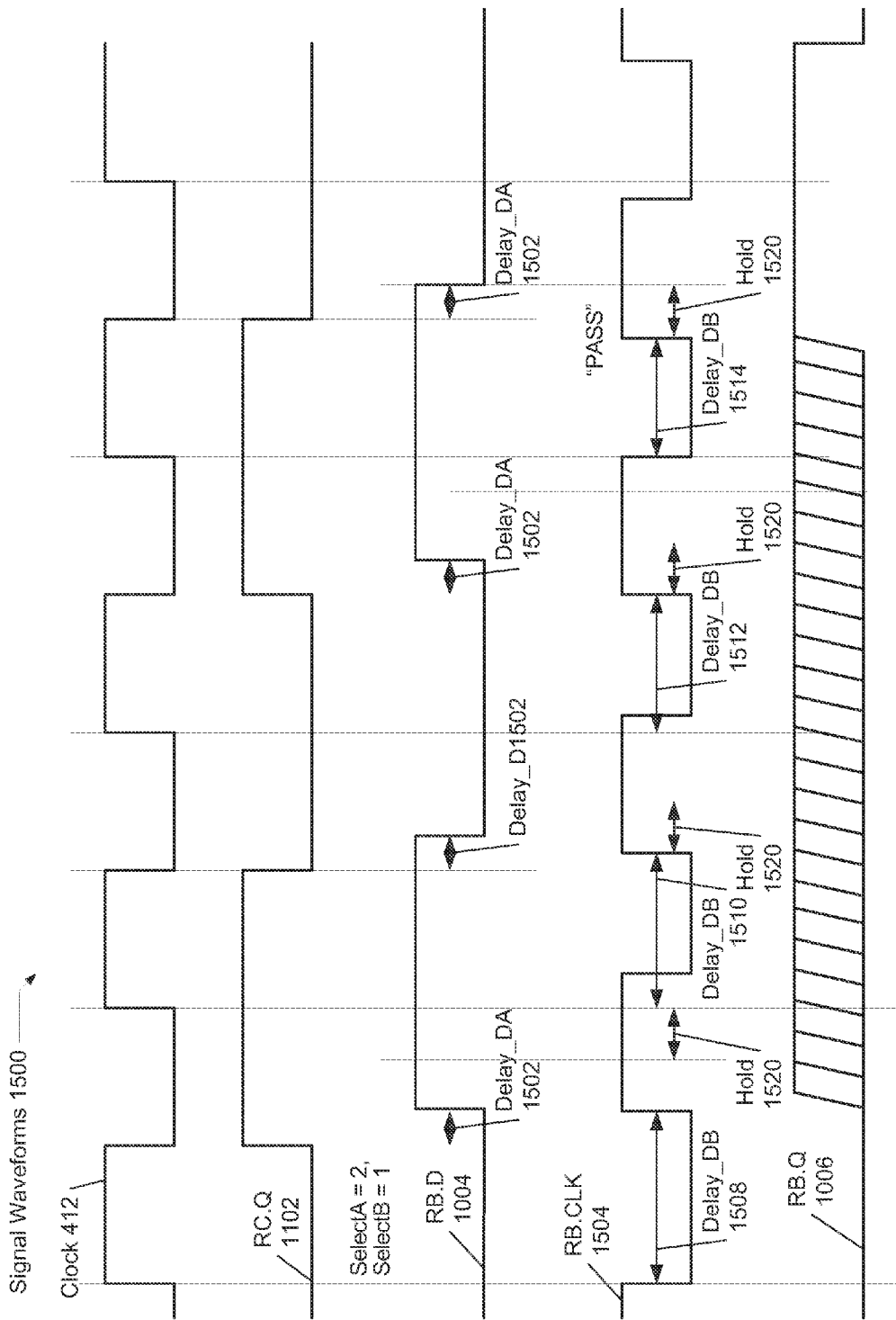
FIG. 15 is a generalized block diagram illustrating one embodiment of test signal waveforms for a hold time measurement.

Referring now to FIG. 15, a generalized block diagram illustrating one embodiment of test signal waveforms 1500 for a hold time measurement is shown. As shown, a tunable delay may continue to decrease by incremental steps from Delay_DB 1508 to Delay_DB 1514 until a passed condition is detected. The passed condition may be a data input signal is successfully stored by a given sequential element.

With the circuit implementation shown in the circuit 400, the flip-flop RC 434 may receive the clock signal 412. The flip-flop RC 434 may be a negative-edge triggered flip-flop. The select values SelectA 414 and 416 may be set to 2 and 1, respectively. The tunable delay line DA 450 may be set to a minimal delay value shown as Delay_DA 1502. Similar to the above tests, the clock signal 412 may be supplied to the flip-flop RB 432 via MuxA 440 and the tunable delay line DB 452.

The data input on the flip-flop RB 432 may receive the toggling output of the flip-flop RC 434 after the delays of the clock-to-Q propagation of the flip-flop RC 434, the MuxB 442 and the tunable delay line DA 450. The tunable delay line DB 452 may have its delay decremented until the flip-flop RB 432 is able to store the output from the flip-flop RC 434. The delay from the rising edge of the clock signal RB.CLK 1504 to a transition of the data input RB.D 1004 that allows successful storage of the data input may be proportional to the hold time of the flip-flop RB 432. This delay is shown as hold 1520. The checker 460 may verify a successful capture and storage and provide a corresponding indication the output line status 418.

Figure 16:
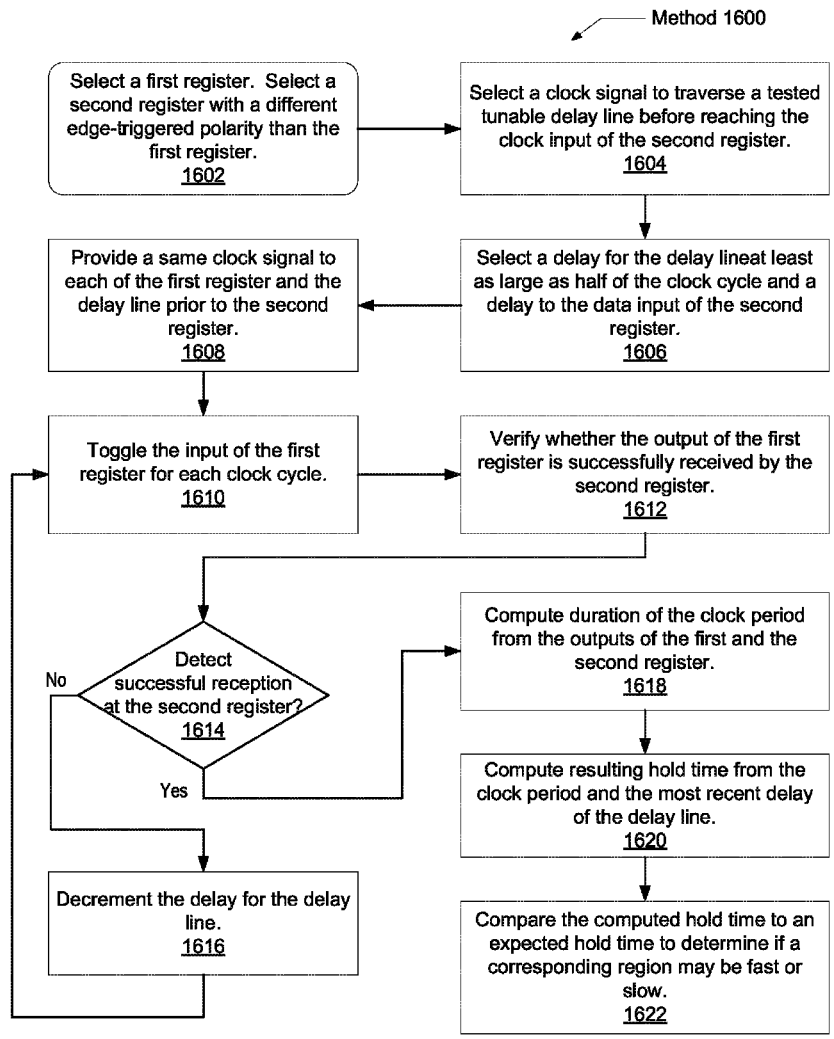
FIG. 16 is a generalized flow diagram illustrating one embodiment of a method for measuring a hold time for a given region of an IC.

Referring now to FIG. 16, a generalized flow diagram of one embodiment of a method 1600 for measuring a hold time for a given region of an IC is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 1602, a first register is selected. In one embodiment, the first register may be a flip-flop circuit. A second register may be selected with a different edge-triggered polarity than the first register. For example, the first register may be a negative-edge triggered flip-flop and the second register is a positive-edge triggered flip-flop. In block 1604, a clock signal is selected to traverse a tested tunable delay line before reaching the clock input of the second register. In block 1606, a delay may be selected for the delay line that is at least as large as half of the clock cycle and a delay to the data input of the second register.

In block 1608, a same clock signal may be provided to each of the first register and the delay line prior to the second register. In block 1610, the input of the first register may be toggled for each clock cycle. In block 1612, whether the second register successfully receives the output of the first register may be verified. If the second register does not successfully receive the output of the first register (conditional block 1614), then in block 1616, the delay of the tunable delay line between the clock input to the first register and the clock input of the second register is decremented.

If the second register does not successfully receive the output of the first register (conditional block 1614), then in block 1618, the duration of the clock period may be computed from the outputs of the first and the second register. In block 1620, the resulting hold time may be computed from the clock period and the most recent delay of the delay line. In block 1622, the computed hold time may be compared to an expected hold time to determine if a corresponding region may be fast or slow. This result may be conveyed to control logic within the distributed monitors 112*a*-112*c*.

Figure 17:
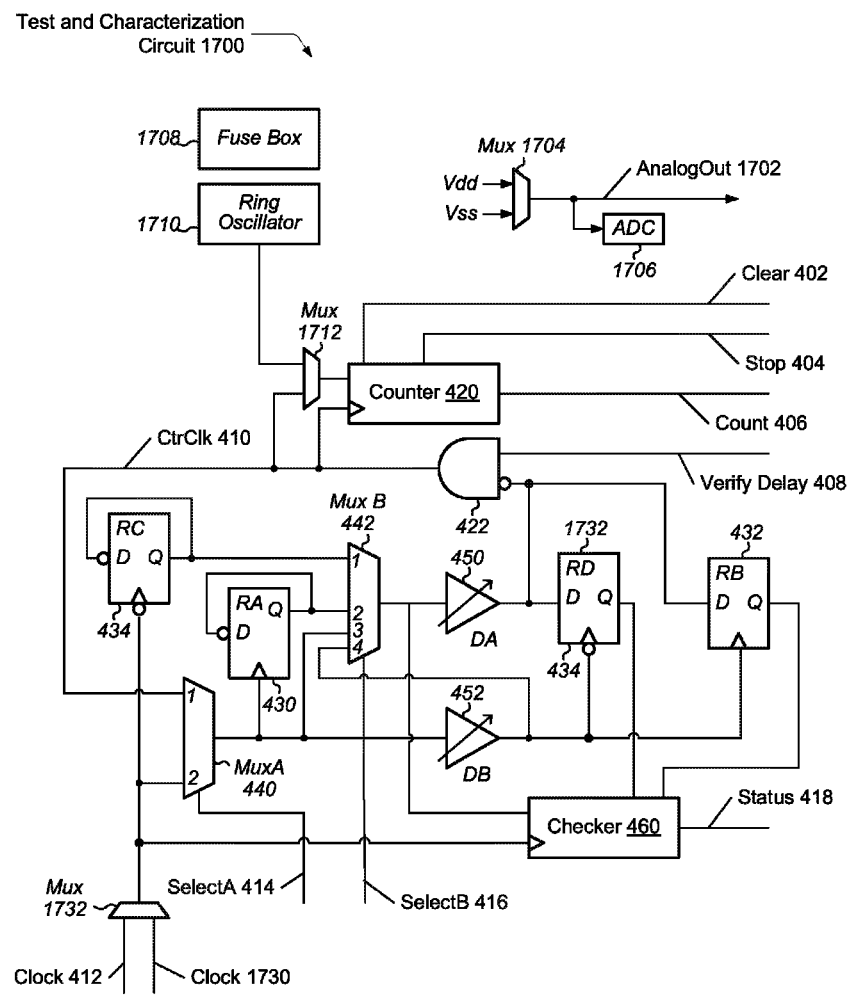
FIG. 17 is a generalized block diagram illustrating another embodiment of a test and characterization circuit.

Turning now to FIG. 17, a generalized block diagram of another embodiment of a test and characterization circuit 1700 is shown. Each of the monitors 112*a*-112*c* may include the circuit 1700. Logic and circuitry described earlier and used again here is numbered identically. The circuit 1700 may include additional circuitry than circuit 400, such as the analog mux 1704 and the analog-to-digital converter (ADC) 1706. The mux 1704 and ADC 1706 may be used to measure the local power supply voltage Vdd and the local ground reference Vss within a respective region. The output of the mux 1704 may be routed to a pad and/or to the ADC 1706 for observation.

The circuit 1700 may also include a ring oscillator 1710 for testing delays and the counter 420. An additional sequential element may be added, such as the negative-edge triggered flip-flop RD 1732. The flip-flop RD 1732 may be used in place of the flip-flop RB 432 for timing measurements.

The fuse box 1708 may be used to store characterization data. The characterization data may include the delays of the tunable delay lines DA 450 and DB 452 taken during production testing. In addition, the characterization data may include digitized versions of the analog outputs of the muxes 1704 and 1712, which may be used as a reference during device operation in the field. Additionally, multiple clock signals may be provided to the circuit 1700. A mux 1732 may select between the multiple clock signals. As shown, clock 412 and clock 1730 are provided to the circuit 1700.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit (IC) comprising:
   a plurality of physical regions comprising circuitry; and
   one or more monitors within one or more of the physical regions, wherein respective circuitry within a monitor of the one or more monitors is configured to:
      set a first expected delay for a first tunable delay line;
      provide an on-die input stimulus to the first tunable delay line;
      measure a first actual delay through the first tunable delay line; and
      in response to determining a difference between the first actual delay and the first expected delay is greater than a given threshold, generate a scaling factor comprising a first ratio of the first actual delay to the first expected delay.

2. The integrated circuit as recited in claim 1, wherein to provide the on-die input stimulus, the respective circuitry is further configured to convey an output of the first tunable delay line to an input of the first tunable delay line via at least inverting combinatorial logic.

3. The integrated circuit as recited in claim 2, wherein to measure a second actual delay through a second tunable delay line, the respective circuitry is further configured to:
   set a second expected delay for the second tunable delay line;
   convey the output of the first tunable delay line to an input of the second tunable delay line via the inverting combinatorial logic and a plurality of multiplexers; and
   serially connect the first tunable delay line and the second tunable delay line via the plurality of multiplexers.

4. The integrated circuit as recited in claim 2, wherein the respective circuitry is further configured to adjust a test expected delay for the first tunable delay line by the scaling factor prior to measuring timing characteristics for a plurality of sequential elements coupled to the first tunable delay line via a plurality of multiplexers.

5. The integrated circuit as recited in claim 4, wherein the respective circuitry is further configured to:
   receive a clock signal used by the plurality of sequential elements; and
   adjust a clock expected delay for the second tunable delay line by the scaling factor prior to measuring timing characteristics for the clock signal within a respective physical region.

6. The integrated circuit as recited in claim 4, wherein the timing characteristics for the sequential elements comprise at least one of the following: a setup time and a hold time.

7. The integrated circuit as recited in claim 4, wherein the integrated circuit further comprises an operating mode controller configured to:
   receive timing characteristics for the plurality of sequential elements from the one or more monitors;
   decrease an operational voltage supplied to a given monitor in response to determining the timing characteristics corresponding to the given monitor are fast; and
   increase the operational voltage supplied to the given monitor in response to determining the timing characteristics corresponding to the given monitor are slow.

8. The integrated circuit as recited in claim 2, wherein to measure the first actual delay, the respective circuitry is further configured to toggle a clock input for a counter each time an output of the first tunable delay line transitions between a logic high value and a logic low value.

9. The integrated circuit as recited in claim 8, in response to a given time period is reached after providing the on-die input stimulus, the respective circuitry is further configured to, in response to determining a difference between an output of the counter and a second ratio of the given time period to the first expected delay is greater than a given count threshold, generate a scaling ratio of the output of the counter to the second ratio.

10. A method comprising:
   setting a first expected delay for a first tunable delay line in a physical region of a plurality of physical regions on a die;

providing an on-die input stimulus to the first tunable delay line;

measuring a first actual delay through the first tunable delay line; and in response to determining a difference between the first actual delay and the first expected delay is greater than a given threshold, generating a scaling factor comprising a ratio of the first actual delay to the first expected delay.

11. The method as recited in claim 10, wherein to provide the on-die input stimulus, further comprising conveying an output of the first tunable delay line to an input of the first tunable delay line via at least inverting combinatorial logic.

12. The method as recited in claim 11, wherein to provide one of a plurality of sources for the on-die input stimulus and reuse the first tunable delay line for multiple tests, further comprising selecting via a plurality of multiplexers between outputs of the inverting combinatorial logic and a plurality of sequential elements.

13. The method as recited in claim 12, wherein to measure a second actual delay through a second tunable delay line, further comprises:

setting a second expected delay for the second tunable delay line;

conveying the output of the first tunable delay line to an input of the second tunable delay line via the inverting combinatorial logic and the plurality of multiplexers; and serially connecting the first tunable delay line and the second tunable delay line via the plurality of multiplexers.

14. The method as recited in claim 13, wherein during measuring of each of the first tunable delay line and the second tunable delay line, the plurality of multiplexers are set in a manner to disconnect each one of the plurality of the sequential elements from the serial connection.

15. The method as recited in claim 12, further comprising adjusting a test expected delay for the first tunable delay line by the scaling factor prior to measuring timing characteristics for the plurality of sequential elements.

16. The method as recited in claim 15, further comprising:

receiving a clock signal used by the plurality of sequential elements; and adjusting a clock expected delay for the second tunable delay line by the scaling factor prior to measuring timing characteristics for the clock signal within a respective physical region.

17. The method as recited in claim 16, wherein at least one sequential element of the plurality of sequential elements uses an inverted version of a clock signal used by one or more of the plurality of sequential elements to receive and store new data.

18. The method as recited in claim 17, wherein the at least one sequential element is used to measure a duty cycle within a respective physical region of a received clock signal.

19. A system-on-a-chip (SOC) comprising:

a plurality of integrated circuit (IC) dies comprising one or more pipeline stages, wherein at least two dies execute instructions from distinct instruction set architectures (ISAs);

a system controller configured to issue a given instruction to a given one of the plurality of dies;

wherein at least one of the plurality of dies comprises one or more monitors configured to:

set a first expected delay for a first tunable delay line;

provide an on-die input stimulus to the first tunable delay line;

measure a first actual delay through the first tunable delay line; and in response to determining a difference between the first actual delay and the first expected delay is greater than a given threshold, generate a scaling factor comprising a first ratio of the first actual delay to the first expected delay.

20. The SOC as recited in claim 19, wherein to provide the on-die input stimulus, the monitor is further configured to convey an output of the first tunable delay line to an input of the first tunable delay line via at least inverting combinatorial logic.

21. The SOC as recited in claim 20, wherein the monitor is further configured to adjust a test expected delay for the first tunable delay line by the scaling factor prior to measuring timing characteristics for a plurality of sequential elements coupled to the first tunable delay line via a plurality of multiplexers.

22. The SOC as recited in claim 21, wherein the monitor is further configured to send the timing characteristics to at least one of an operating mode controller within the monitor and the system controller for adjusting an operational voltage supplied to a respective one of the plurality of dies.

23. An apparatus on an integrated circuit (IC) comprising:

a first interface configured to receive a clock signal used by sequential elements both within and near the apparatus and test control signals;

a second interface configured to send timing test results to an operating mode controller for adjusting an operational voltage supplied to the apparatus;

a timing parameter table configured to store timing characteristics for at least tunable delay lines and sequential elements both within and near the apparatus; and characterization circuitry configured to:

set a first expected delay for a first tunable delay line;

provide an on-die input stimulus to the first tunable delay line;

measure a first actual delay through the first tunable delay line; and in response to determining a difference between the first actual delay and the first expected delay is greater than a given threshold, generate a scaling factor comprising a first ratio of the first actual delay to the first expected delay.

24. The apparatus as recited in claim 23, wherein to measure a second actual delay through a second tunable delay line, the characterization circuitry is further configured to:

set a second expected delay for the second tunable delay line;

convey the output of the first tunable delay line to an input of the second tunable delay line via the inverting combinatorial logic and a plurality of multiplexers; and serially connect the first tunable delay line and the second tunable delay line via the plurality of multiplexers.

25. The apparatus as recited in claim 23, wherein the characterization circuitry is further configured to adjust a test expected delay for the first tunable delay line by the scaling factor prior to measuring timing characteristics for a plurality of sequential elements coupled to the first tunable delay line via a plurality of multiplexers.

* * * * *